(12) United States Patent
Kobayashi

(10) Patent No.: US 8,329,558 B2
(45) Date of Patent: Dec. 11, 2012

(54) WAFER PROCESSING METHOD

(75) Inventor: Yoshikazu Kobayashi, Ota-Ku (JP)

(73) Assignee: Disco Corporation, Tokyo (JP)

( * ) Notice: Subject to any disclaimer, the term of this patent is extended or adjusted under 35 U.S.C. 154(b) by 86 days.

(21) Appl. No.: 13/104,399

(22) Filed: May 10, 2011

(65) Prior Publication Data

US 2011/0287609 A1    Nov. 24, 2011

(30) Foreign Application Priority Data

May 21, 2010    (JP) .................. 2010-117037

(51) Int. Cl.
*H01L 21/30* (2006.01)
*H01L 21/46* (2006.01)

(52) U.S. Cl. ............. 438/459; 438/460; 257/E21.599

(58) Field of Classification Search ............... 438/459, 438/460, 462, 464; 257/E21.599
See application file for complete search history.

(56) References Cited

U.S. PATENT DOCUMENTS

2010/0055877 A1*    3/2010    Kajiyama et al. ............. 438/464

FOREIGN PATENT DOCUMENTS

| JP | 2003-249620 | 9/2003 |
|---|---|---|
| JP | 2004-095849 | 3/2004 |
| JP | 2004-119593 | 4/2004 |

* cited by examiner

*Primary Examiner* — Hoai V Pham
(74) *Attorney, Agent, or Firm* — Greer, Burns & Crain, Ltd.

(57) ABSTRACT

A processing method for a wafer having a device area where a plurality of devices are formed on the front side of the wafer and a peripheral marginal area surrounding the device area. The processing method includes a reinforcing plate forming step of applying a heat-resistant bond to the front side of the wafer and solidifying the heat-resistant bond to thereby form a reinforcing plate from only the heat-resistant bond, a back grinding step of holding the reinforcing plate on a chuck table and grinding the back side of the wafer in the device area to thereby form a circular recess in the device area and leave an annular reinforcing portion in the peripheral marginal area, a through electrode forming step of forming a through electrode connected to an electrode of each device formed on the front side of the wafer, from the back side of the wafer fixed to the reinforcing plate, and a reinforcing plate removing step of supplying a solvent for dissolving the heat-resistant bond to the reinforcing plate, thereby removing the reinforcing plate.

2 Claims, 8 Drawing Sheets

WAFER PROCESSING METHOD

BACKGROUND OF THE INVENTION

1. Field of the Invention

The present invention relates to a wafer processing method including the steps of grinding the back side of a wafer and next forming a through electrode connected to an electrode of each device formed on the front side of the wafer from the back side of the wafer.

2. Description of the Related Art

A plurality of devices such as ICs and LSIs are formed on the front side of a semiconductor wafer so as to be partitioned by a plurality of crossing division lines. The semiconductor wafer is divided into the individual devices by a dicing apparatus, and these devices divided from each other are widely used in various electrical equipment such as a mobile phone and a personal computer.

In recent semiconductor device technology, a stacked semiconductor package such that a plurality of semiconductor chips are stacked is effectively used in achieving a higher density and a reduction in size and thickness. In this semiconductor device technology, the back side of a wafer is ground by abrasive members to reduce the thickness of the wafer to about 50 μm, and thereafter a through electrode is formed from the back side of the wafer so as to be connected to an electrode of each device formed on the front side of the wafer. Accordingly, before grinding the back side of the wafer, a reinforcing plate is attached through a bond to the front side of the wafer.

However, in forming the through electrode connected to the electrode of each device, the wafer is exposed to an environment of relatively high temperature. Accordingly, an epoxy bond having a strength of enduring a high temperature of 250° C. is used as the bond for attaching the reinforcing plate to the front side of the wafer. Thus, the bond has a strength of enduring a high temperature of 250° C. Accordingly, in removing the reinforcing plate from the front side of the wafer, the reinforcing plate is heated to raise the temperature of the bond to greater than 250° C., and the reinforcing plate is slid on the front side of the wafer and removed therefrom without applying a load to the wafer.

SUMMARY OF THE INVENTION

In such a conventional wafer processing method, a heat-resistant bond having a strength of enduring a high temperature of 250° C. is used as the bond for attaching the reinforcing plate to the wafer. Accordingly, it is difficult to remove the reinforcing plate from the front side of the wafer after forming the through electrode in the wafer.

It is therefore an object of the present invention to provide a wafer processing method in which the reinforcing plate can be easily removed from the front side of the wafer.

In accordance with an aspect of the present invention, there is provided a processing method for a wafer having a device area where a plurality of devices are formed on the front side of said wafer and a peripheral marginal area surrounding said device area, said processing method including a reinforcing plate forming step of applying a heat-resistant bond to the front side of said wafer and solidifying said heat-resistant bond to thereby form a reinforcing plate from only said heat-resistant bond; a back grinding step of holding said reinforcing plate on a chuck table and grinding the back side of said wafer in said device area to thereby form a circular recess in said device area and leave an annular reinforcing portion in said peripheral marginal area; a through electrode forming step of forming a through electrode connected to an electrode of each device formed on the front side of said wafer, from the back side of said wafer fixed to said reinforcing plate; and a reinforcing plate removing step of supplying a solvent for dissolving said heat-resistant bond to said reinforcing plate, thereby removing said reinforcing plate.

Preferably, the processing method for the wafer further includes a wafer supporting step of attaching the back side of said wafer to a dicing tape supported at its outer circumferential portion to an annular frame after performing said reinforcing plate removing step, thereby supporting said wafer through said dicing tape by said annular frame; and a wafer dividing step of dividing said wafer supported by said annular frame into said individual devices.

According to the present invention, although the reinforcing plate is formed from only the heat-resistant bond, the back side of the wafer is ground so as to leave the annular reinforcing portion in the outer circumferential portion of the wafer in the back grinding step, so that the strength of the wafer is maintained by the annular reinforcing portion and the through electrode forming step can be performed without hindering the handling performance. Further, in the reinforcing plate removing step, the reinforcing plate can be simply removed by only supplying the solvent for dissolving the heat-resistant bond to the reinforcing plate, thereby improving the productivity.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
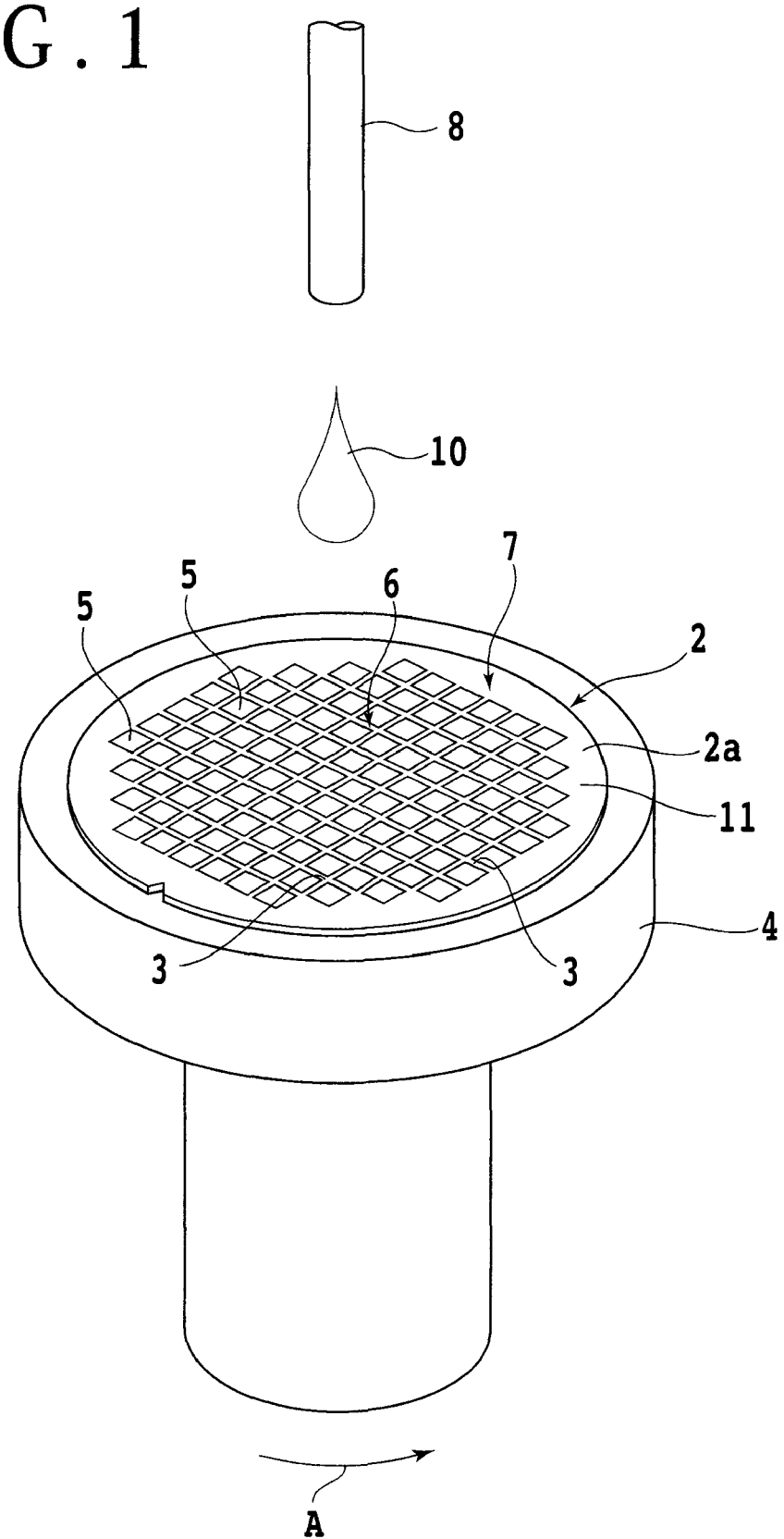
FIG. 1 is a perspective view showing a heat-resistant bond supplying step.

A preferred embodiment of the present invention will now be described in detail with reference to the drawings. Referring to FIG. 1, there is shown a perspective view for illustrating a heat-resistant bond supplying step. In this preferred embodiment, a heat-resistant bond 10 is supplied to the front side 2a of a semiconductor wafer (which will be hereinafter referred to simply as wafer) 2 by spin coating. First, the wafer 2 is held under suction on a rotatable chuck table 4. A plurality of crossing streets (division lines) 3 are formed on the front side 2a of the wafer 2 to partition a plurality of regions where a plurality of devices 5 such as ICs and LSIs are respectively formed. The wafer 2 has a device area 6 where the plural devices 5 are formed on the front side 2a and a peripheral marginal area 7 surrounding the device area 6.

The heat-resistant bond 10 is supplied to the front side 2a of the wafer 2 by spin coating in such a manner that the chuck table 4 is rotated in the direction shown by an arrow A in FIG. 1 at about 300 rpm, for example, and the heat-resistant bond 10 is dropped from a heat-resistant bond dropping member 8 onto the front side 2a of the wafer 2. When the chuck table 4 is rotated for at least five seconds, the heat-resistant bond 10 dropped is uniformly applied by spin coating on the front side 2a of the wafer 2 to thereby form a heat-resistant bond layer. The heat-resistant bond 10 is formed of epoxy resin and has a strength of enduring a high temperature of 250° C.

Figure 2A:
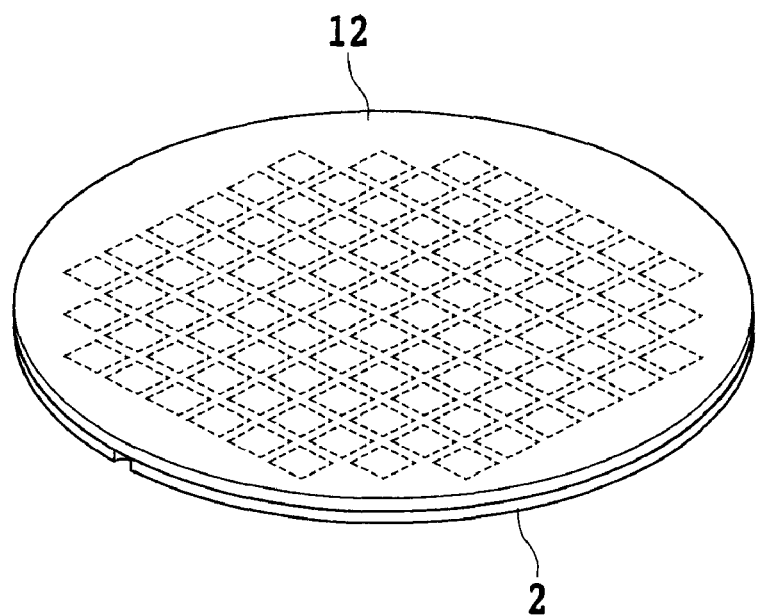
FIG. 2A is a perspective view showing a condition where a reinforcing plate formed from a heat-resistant bond is fixed to a wafer as viewed from the front side of the wafer.
Figure 2B:
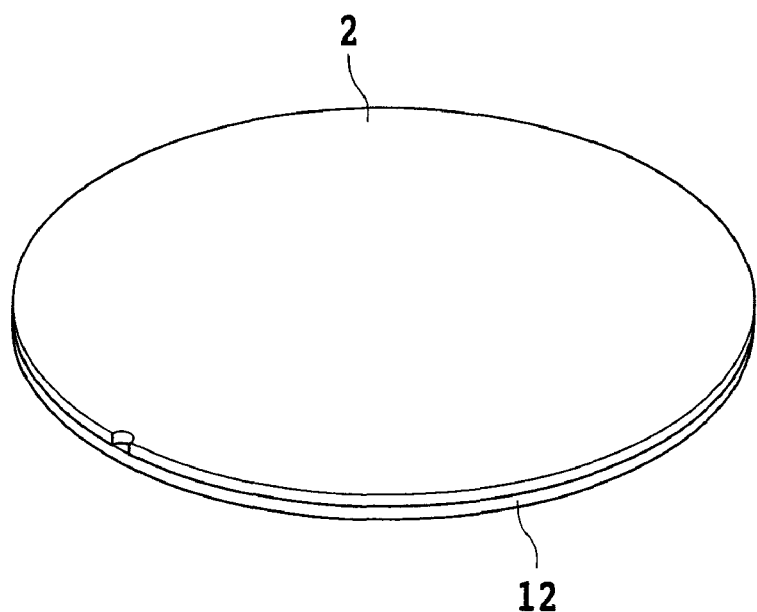
FIG. 2B is a perspective view showing the back side of the wafer shown in FIG. 2A.

After forming the heat-resistant bond layer having a uniform thickness on the front side 2a of the wafer 2, baking is performed at a predetermined temperature for a predetermined time to thereby integrally fix a reinforcing plate 12 formed from the heat-resistant bond layer to the front side of the wafer 2 as shown in FIG. 2A. FIG. 2B is a perspective view obtained by reversing the unit of the wafer 2 and the reinforcing plate 12.

Figure 3:
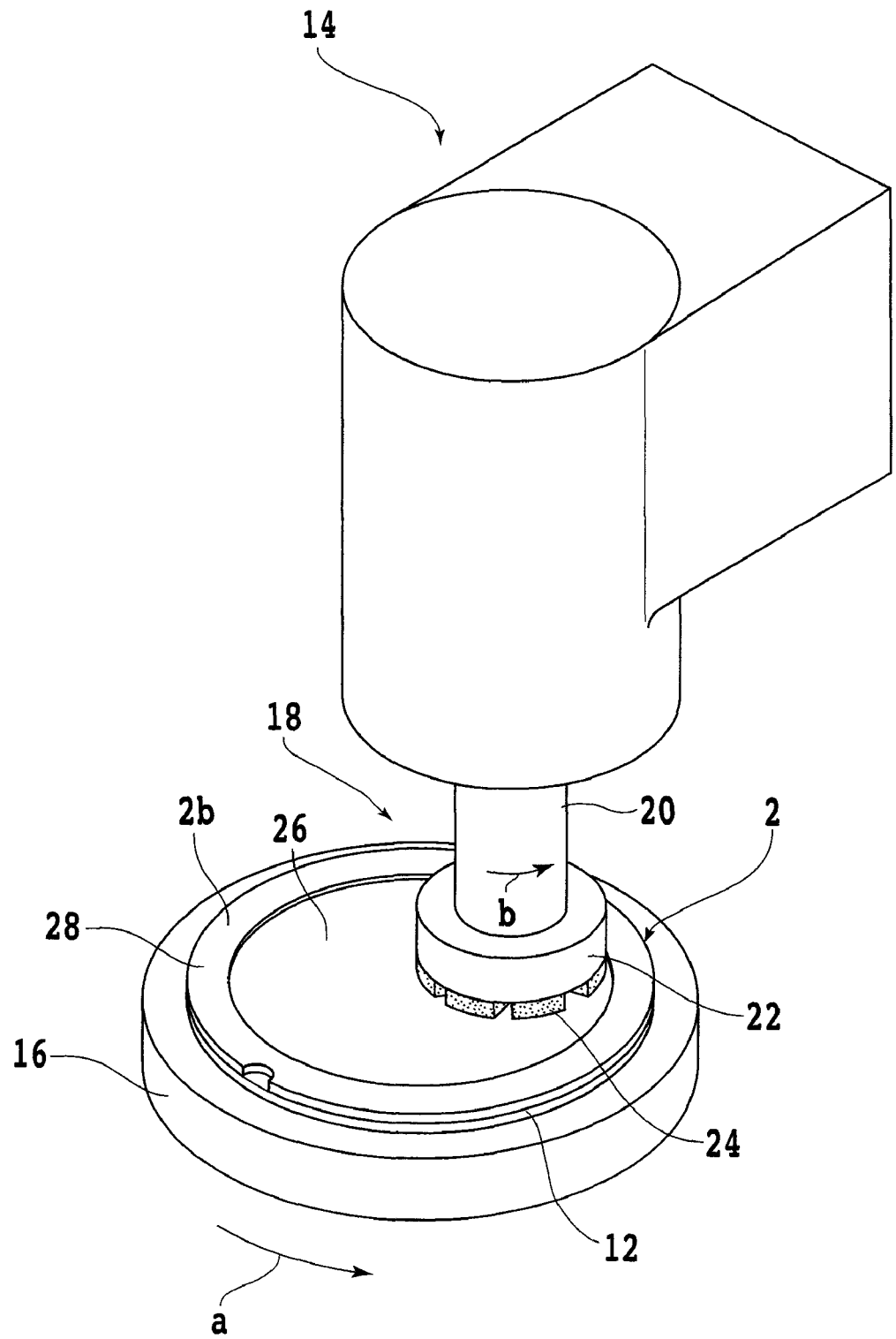
FIG. 3 is a perspective view showing a back grinding step of grinding the back side of the wafer.
Figure 4:
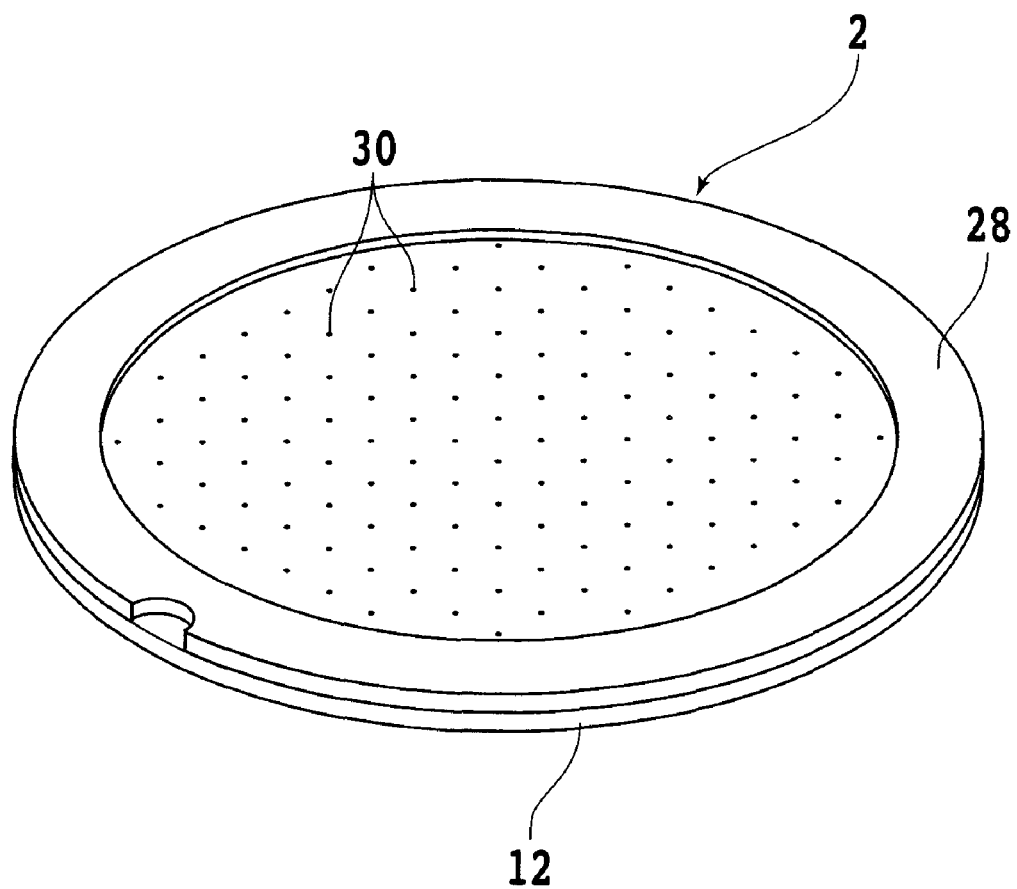
FIG. 4 is a perspective view for illustrating a through electrode forming step.

After integrally fixing the reinforcing plate 12 formed from the heat-resistant bond layer to the front side of the wafer 2, a back grinding step of grinding the back side of the wafer 2 is performed. This back grinding step is performed by using a grinding apparatus 14 essentially shown in FIG. 3. The grinding apparatus 14 includes a rotatable chuck table 16 for holding the reinforcing plate 12 and a grinding unit 18 for grinding the wafer 2. The grinding unit 18 is composed of a rotatable and vertically movable spindle 20 and a grinding wheel 22 having a plurality of abrasive members 24 fixed on the lower surface.

The reinforcing plate 12 fixed to the wafer 2 is held under suction on the chuck table 16, and the back side 2b of the wafer 2 is opposed to the abrasive members 24. The chuck table 16 is rotated in the direction shown by an arrow a in FIG. 3 at 300 rpm, for example, and the abrasive members 24 are rotated in the direction shown by an arrow b in FIG. 3 at 6000 rpm, for example. Further, a feed mechanism (not shown) is operated to bring the abrasive members 24 of the grinding wheel 22 into contact with the back side 2b of the wafer 2. Then, the grinding wheel 22 is fed downward by a predetermined amount at a predetermined feed speed. As a result, the back side 2b of the wafer 2 is ground in a central area corresponding to the device area 6 to thereby form a circular recess 26 having a predetermined depth (e.g., 50 µm for the thickness of the device area 6). At the same time, a peripheral area of the back side 2b corresponding to the peripheral marginal area 7 is left to form an annular reinforcing portion 28 including the peripheral marginal area 7.

After performing the grinding step, a through electrode forming step is performed in such a manner that a through electrode 30 connected to an electrode of each device 5 formed on the front side 2a of the wafer 2 is formed from the back side 2b of the wafer 2 integrally fixed to the reinforcing plate 12. In this through electrode forming step, a plurality of through holes are first formed through the wafer 2 by applying a laser beam, for example. As this laser beam, a laser beam having an absorption wavelength (e.g., 355 nm) to the wafer 2 is used. Preferably, third-harmonic generation in a YAG laser or YVO4 laser is used.

Thereafter, each through hole is filled with an insulator of polymer material or the like. As a method of filling each through hole with the insulator, a liquid-phase method is preferably used. In the liquid-phase method, the wafer 2 need not be heated to a high temperature, so that the wafer 2 preliminarily formed with the devices 5 can be used. Thereafter, the insulator filling each through hole formed through the wafer 2 is processed by a laser beam or etched by a lithography process to thereby form a new through hole through the insulator. Thereafter, this through hole is filled with a conductor such as copper, nickel, palladium, gold, and silver.

A method of filling this through hole with the conductor may be selected from dry plating, wet plating, jet painting, film deposition of conductive paste or molten metal, etc. Each through electrode 30 is so formed as to extend between the front side 2a and back side 2b of the wafer 2 and is electrically connected to the electrode of each device 5 formed on the front side 2a of the wafer 2.

Although the reinforcing plate 12 is formed from only the heat-resistant bond in this preferred embodiment, the strength of the wafer 2 can be sufficiently maintained by the annular reinforcing portion 28 formed along the outer circumference of the wafer 2. Accordingly, the through electrode forming step mentioned above can be performed without hindering the handling performance.

Figure 5:
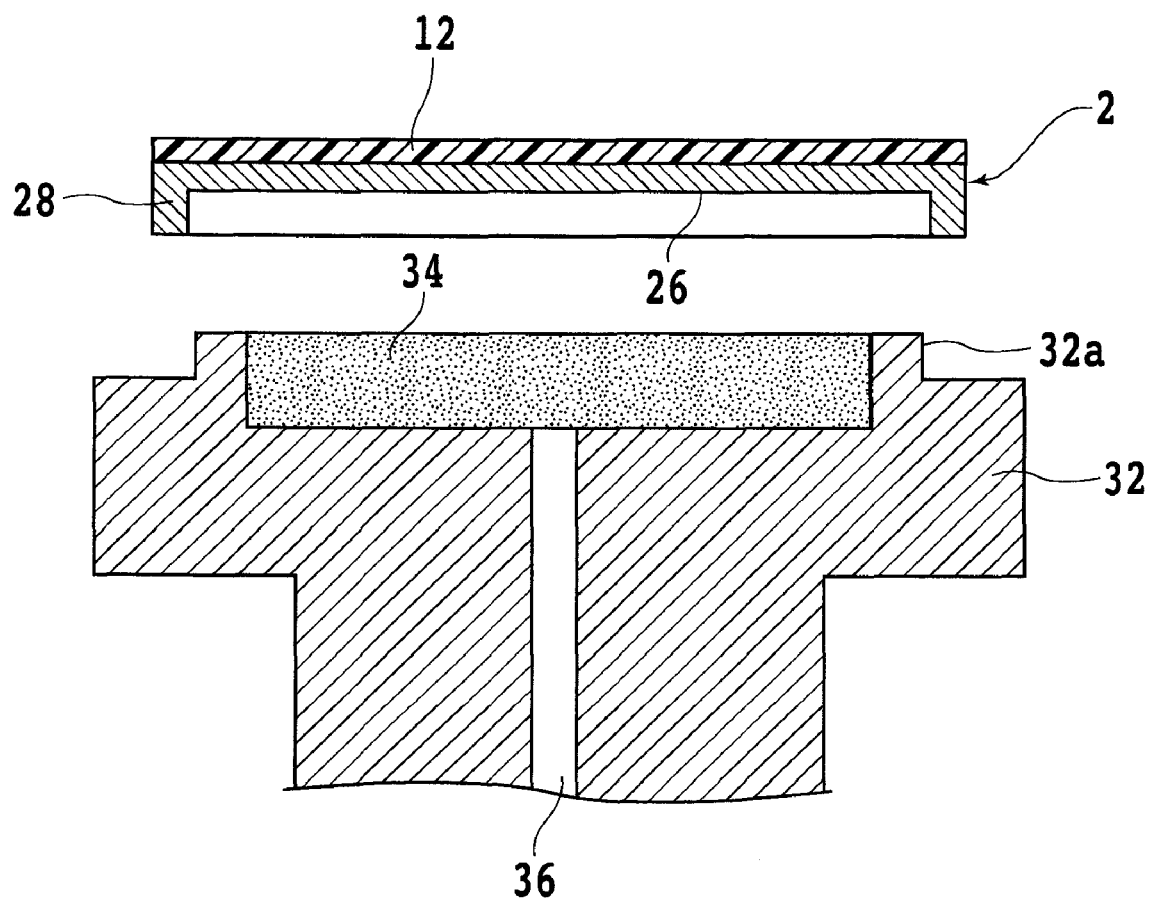
FIG. 5 is a vertical sectional view of a chuck table suitably used in a reinforcing plate removing step.

After performing the through electrode forming step, the wafer 2 having the circular recess 26 is held under suction by using a chuck table 32 shown in FIG. 5. The chuck table 32 has a small-diameter portion 32a having a diameter slightly smaller than that of the circular recess 26 of the wafer 2. A suction holding portion 34 of porous ceramic or the like is provided in the small-diameter portion 32a. The suction holding portion 34 is connected through a suction passage 36 to a vacuum source (not shown).

Figure 6:
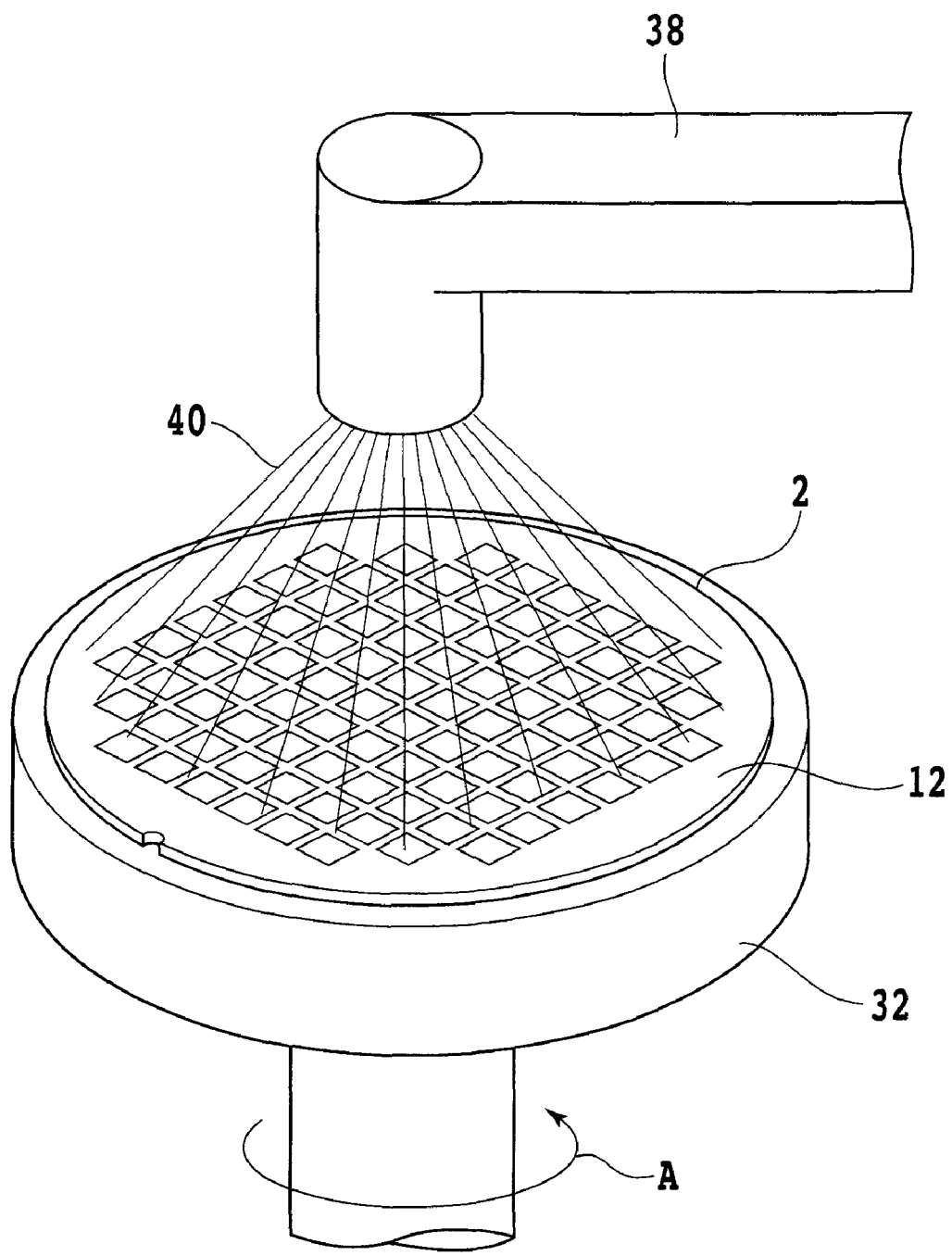
FIG. 6 is a perspective view showing the reinforcing plate removing step.
Figure 7:
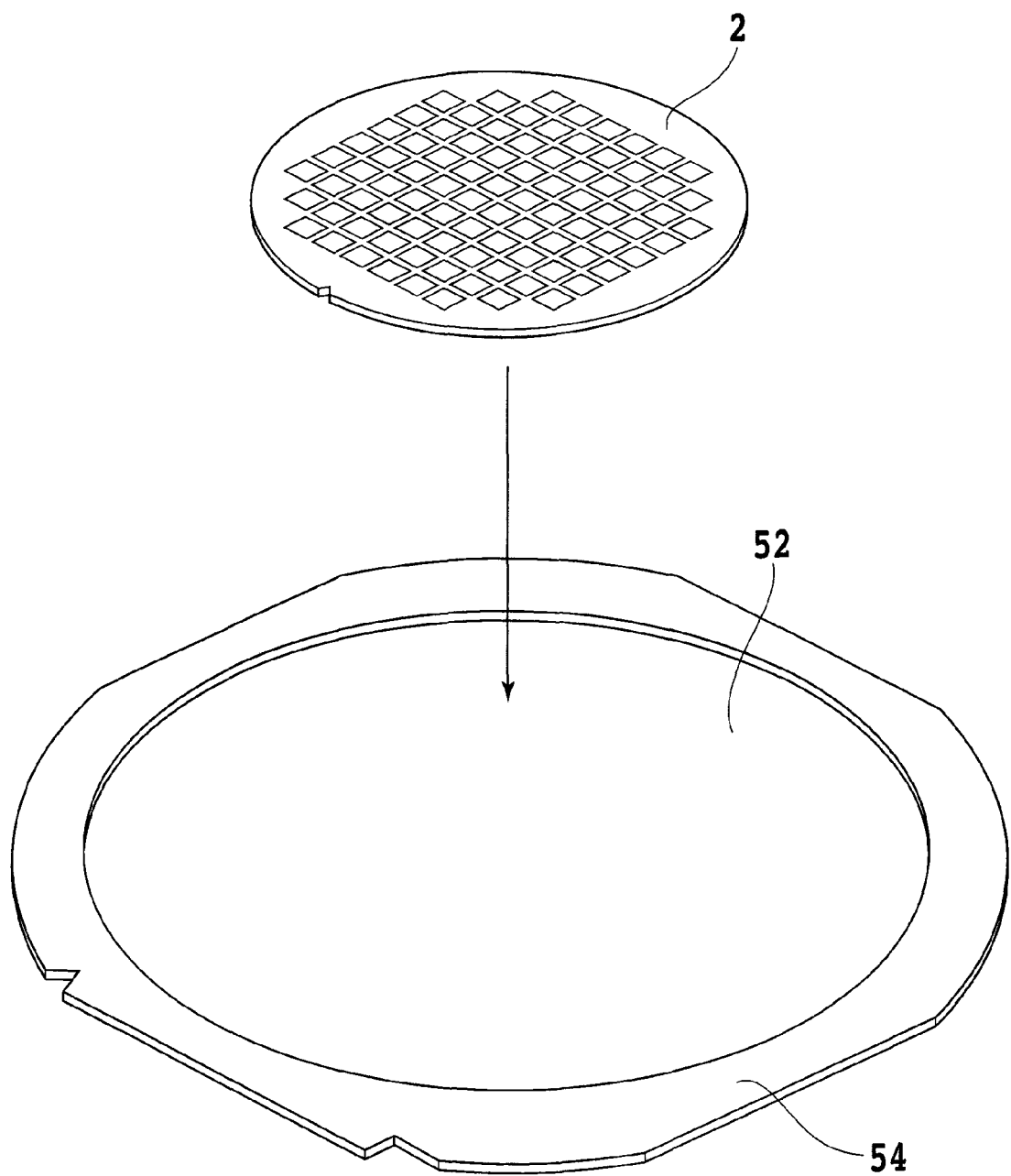
FIG. 7 is a perspective view showing a wafer supporting step.

As shown in FIG. 6, the wafer 2 is held under suction on the chuck table 32, and the chuck table 32 is rotated in the direction shown by an arrow A. In this condition, a solvent 40 such as methyl ethyl ketone is supplied from a solvent supplying apparatus 38 to the reinforcing plate 12 formed from the heat-resistant bond. As a result, the reinforcing plate 12 is dissolved by the solvent 40, so that the reinforcing plate 12 formed from the heat-resistant bond can be removed from the front side of the wafer 2. After removing the reinforcing plate 12 from the front side of the wafer 2, a wafer supporting step is performed in such a manner that the back side of the wafer 2 is attached to a dicing tape 52 supported at its outer circumferential portion to an annular frame 54 as shown in FIG. 7, thereby supporting the wafer 2 through the dicing tape 52 by the annular frame 54.

Figure 8:
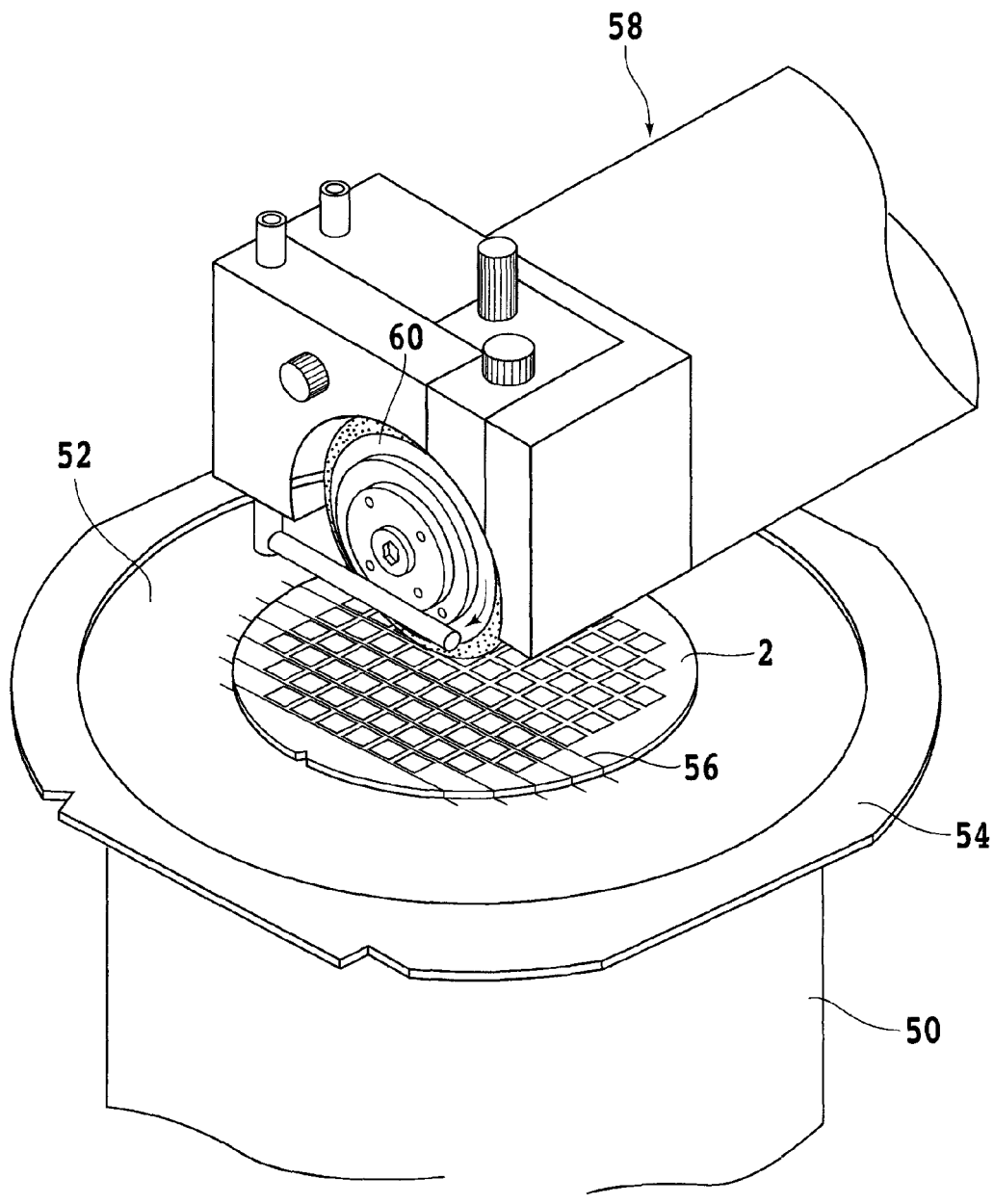
FIG. 8 is a perspective view showing a wafer dividing step.

Thereafter, as shown in FIG. 8, a wafer dividing step is performed in such a manner that the wafer 2 is held under suction through the dicing tape 52 on a chuck table 50 of a cutting apparatus, and the wafer 2 is fully cut along the division lines 3 by using a cutting blade 62 of a cutting unit 58 to form cut grooves 56, thus dividing the wafer 2 into the individual devices 5. When all of the streets 3 extending in a first direction are cut as indexing the cutting blade 62 by the pitch of the streets 3, the chuck table 50 is rotated 90° and all of the streets 3 extending in a second direction perpendicular to the first direction are next cut to divide the wafer 2 into the individual devices 5.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for a wafer having a device area where a plurality of devices are formed on the front side of said wafer and a peripheral marginal area surrounding said device area, said processing method comprising:

- a reinforcing plate forming step of applying a heat-resistant bond to the front side of said wafer and solidifying said heat-resistant bond to thereby form a reinforcing plate from only said heat-resistant bond;
- a back grinding step of holding said reinforcing plate on a chuck table and grinding the back side of said wafer in said device area to thereby form a circular recess in said device area and leave an annular reinforcing portion in said peripheral marginal area;
- a through electrode forming step of forming a through electrode connected to an electrode of each device formed on the front side of said wafer, from the back side of said wafer fixed to said reinforcing plate; and
- a reinforcing plate removing step of supplying a solvent for dissolving said heat-resistant bond to said reinforcing plate, thereby removing said reinforcing plate.

2. The processing method for a wafer according to claim 1, further comprising:

- a wafer supporting step of attaching the back side of said wafer to a dicing tape supported at its outer circumferential portion to an annular frame after performing said reinforcing plate removing step, thereby supporting said wafer through said dicing tape by said annular frame; and
- a wafer dividing step of dividing said wafer supported by said annular frame into said individual devices.

* * * * *